United States Patent [19]
Wong et al.

[11] Patent Number: 5,712,826
[45] Date of Patent: Jan. 27, 1998

[54] APPARATUS AND A METHOD FOR EMBEDDING DYNAMIC STATE MACHINES IN A STATIC ENVIRONMENT

[75] Inventors: Keng L. Wong; Roshan Fernando, both of Portland, Oreg.

[73] Assignee: Intel Corporation, Santa Clara, Calif.

[21] Appl. No.: 624,704

[22] Filed: Mar. 26, 1996

[51] Int. Cl.⁶ .................................................. H03K 19/00
[52] U.S. Cl. .......................... 365/226; 365/227; 365/229; 326/93; 326/95
[58] Field of Search ........................... 326/93, 95, 96; 395/750; 365/226, 227, 229

[56] References Cited

U.S. PATENT DOCUMENTS 5,481,731  1/1996  Conary et al. ........................... 395/750
5,587,672  12/1996  Ranganathan et al. .................... 326/93

Primary Examiner—Viet Q. Nguyen
Attorney, Agent, or Firm—Blakely, Sokoloff, Taylor & Zafman

[57] ABSTRACT

An apparatus and a method for embedding a dynamic state machine in a static integrated circuit environment. A static integrated circuit environment which is capable of suspending operation during a power down clock-stopped condition and resuming operation from a stored state at the conclusion of the power down condition is combined with a dynamic state machine featuring dynamic latches embedded in the static integrated circuit environment. The disclosed dynamic state machine is also configured to suspend operation during the power down condition and resume operation after the power down condition from the stored stated. In addition, both the static integrated circuit environment and the embedded dynamic state machine draw minimal power during the power down condition. With the dynamic state machine embedded in the static integrated circuit environment of the present invention, faster overall circuit operation is realized with less clock capacitance, with less integrated circuit area utilized as well as reduced power consumption.

28 Claims, 3 Drawing Sheets

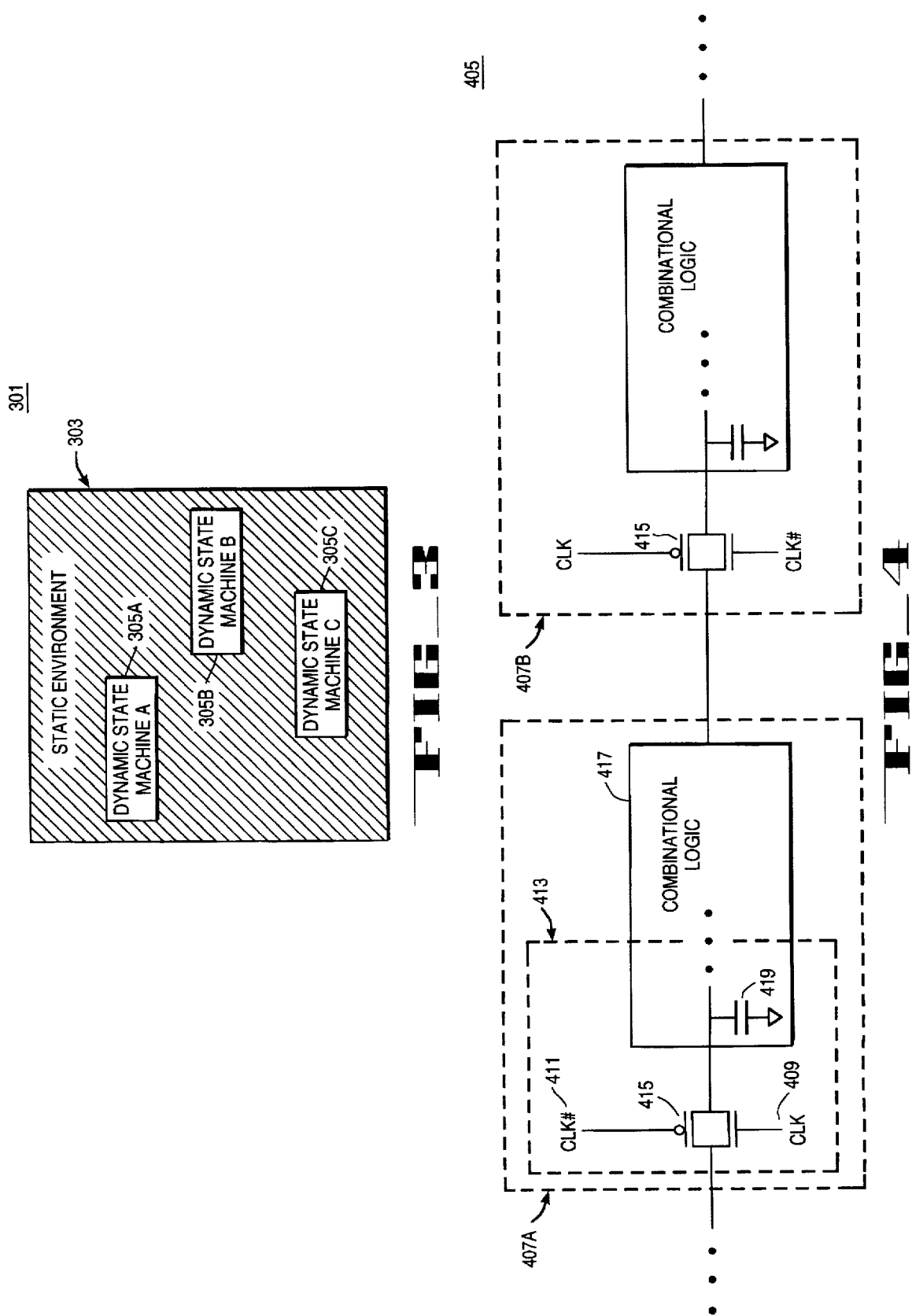

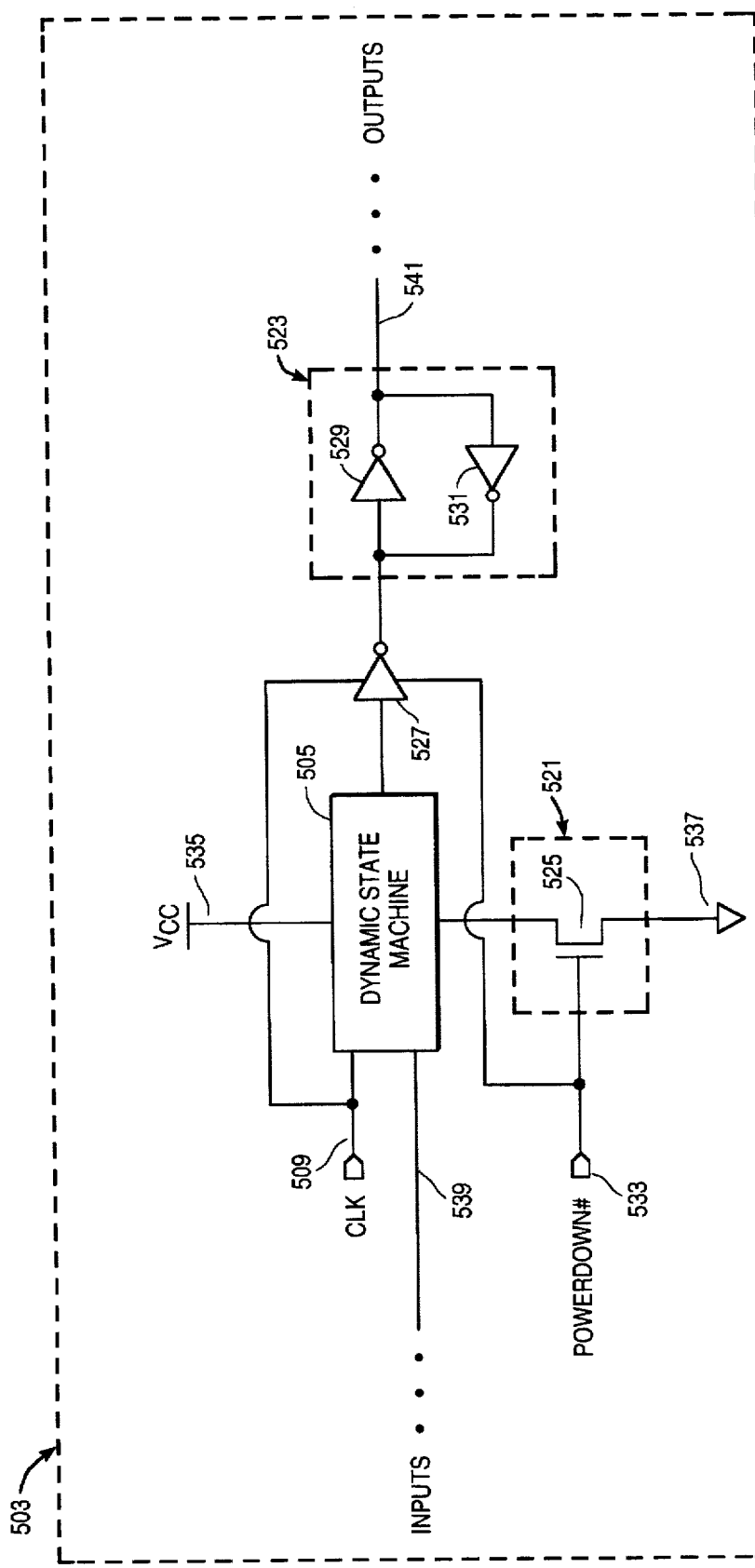
FIG_5

APPARATUS AND A METHOD FOR EMBEDDING DYNAMIC STATE MACHINES IN A STATIC ENVIRONMENT

BACKGROUND OF THE INVENTION

1. Field of the Invention

The present invention relates generally to integrated circuits and more specifically, the present invention relates to static integrated circuit environments.

2. Description of Related Art

Very large scale integration (VLSI) circuits can be classified as static or dynamic. A static circuit is one in which all storage nodes (memory elements) retain memorized values so long as some minimal power is supplied. Clocking of a static circuit is unnecessary in order for the storage nodes of a static circuit to retain memorized values. Accordingly, a static microprocessor has the advantage of being clock-stoppable. This advantage is extremely beneficial in modern microprocessor applications as efforts continue to reduce microprocessor power consumption.

For example, it is desired that modern microprocessors in mobile applications have a "power down" mode in which the clock is stopped and minimal power is drawn by the microprocessor. After such a power down condition, the microprocessor may be "powered up" in the same state or condition it was in at the initiation of the power down condition. Thus, the microprocessor must retain memorized values while in the power down mode with the clock stopped. This type of microprocessor, or integrated circuit environment, is sometimes referred to as a static integrated circuit environment.

In contrast with static circuits are dynamic circuits. Dynamic circuits can only retain memorized values for a relatively short duration of time. Without refresh circuitry or a sufficiently fast clock signal, dynamic circuit memory values may be lost. Accordingly, one fundamental difference between prior art dynamic circuits and static circuits is that prior art dynamic circuits generally cannot be stopped since they lose their state and subsequently cannot resume execution from the same state after the clock is restarted. That is, prior art dynamic circuits are generally not clock-stoppable. Nevertheless, there are advantages for using dynamic circuits. These advantages include relatively high speed, low power consumption, small circuit area and high circuit density. These advantages are further appreciated in view of the continuing efforts in the integrated circuit industry to increase microprocessor speed as well as decrease microprocessor circuit size.

FIG. 1 is a high level block diagram of a typical prior art microprocessor 101 with stop-clock capability, or a power down mode. With the stop-clock capability, microprocessor 101 conserves power when no activity is detected. In today's microprocessors, there is a continuing trend to implement pipelining in order to increase microprocessor speed. Pipelined portions, as well as other portions of the integrated circuit, are shown in FIG. 1 as static state machine A 105A, static state machine B 105B and static state machine C 105C. The state machines shown in static environment 103 feature stop-clock capability. That is, when microprocessor 101 is powered down, static latches in state machine A 105A, state machine B 105 B and state machine C 105 C retain memorized values while the clock is stopped during the power down condition and drawing minimal power. After the power down condition, with the static nature of the static integrated circuit environment 103, static state machine A 105 A, static state machine B 105 B and static state machine C 105 C may resume operation from the stored state.

FIG. 2 shows a simplified schematic of a typical static state machine 205. Static state machine 205 includes a plurality of stages such as stages 207A and 207B. Under control of the clock signals CLK 209 and CLK# 211, signals propagate through state machine 205 from stage 207A through stage 207B. As shown in FIG. 2, stage 207A includes latch 213 coupled to receive an input signal coupled to combinational logic 217. Latch 213 includes a pass gate 215 coupled to storage circuitry including inverter 219 in a front to back configuration with tri-state inverter 221. As shown in FIG. 2, each latch 213 in prior art state machine 205 includes 4 nodes configured to receive clocking signals 209 and 211—two nodes per pass gate 215 and two nodes per tri-state inverter 221. In addition, there is a one inverter plus 1 passgate delay associated with each latch 213 resulting in a two inverter plus 2 passgates delays per clock cycle.

As efforts to increase microprocessor speed continue, circuit designers have identified the need to attain very high speeds in critical sections of a microprocessor. To address this concern, circuit designers have begun "super-pipelining" isolated portions of the microprocessor such as state machine 205 in order to maximize throughput. As a result, the number of stages in each state machine or pipeline is increasing. For example, the two stages, 207 A and 207B, shown in FIG. 2 are transformed into a greater number of stages, such as the 4 stages. With the increased number of stages, clock rate is correspondingly increased to maximize speed. Furthermore, in order to accommodate the increase in clock speed, the number of logic stages in combinational logic 217 is correspondingly decreased. That is, the number of gate delays in combinational logic 217 is also reduced. A side-effect of this trend of super-pipelining state machines is that the proportion of latches 213 increases over the number of devices (not shown) in combinational logic 217. Thus, the gate delays associated with inverter 219 and passgate 215 and the load on clock signals CLK 209 and CLK# 211 becomes increasingly significant. Furthermore, the amount of area occupied by latches such as latch 213 in comparison with combinational logic 217 also increases. As a result, the trend of super-pipelining isolated portions of the microprocessor results in a disproportionate amount of area on the integrated circuit substrate being devoted to latching circuitry which also results in slower performance and an unnecessary reduction in overall microprocessor speed.

Therefore, what is needed is an apparatus and a method to attain very high speed in certain critical sections of a static integrated circuit environment such as a large microprocessor without sacrificing excessive integrated circuit area or speed with the static latches of a static state machine. Furthermore, what is needed is an apparatus and a method for increasing speed in these isolated sections of the static integrated circuit environment without unnecessarily loading the clock signals. The apparatus and method would provide the realization of very high speeds for certain critical sections of a static integrated circuit such as a large microprocessor by using fewer circuit elements to attain faster operation. The apparatus and method would utilize fewer clocking nodes to reduce clock capacitance and occupy a smaller area on the substrate to provide higher circuit density and consume less power.

SUMMARY OF THE INVENTION

A method and apparatus for embedding a dynamic state machine in a static integrated circuit environment is disclosed. In one embodiment, a device in an integrated circuit coupled to a power supply is described. The device includes a static integrated circuit environment that suspends operation during a power down condition, draws minimal power during the power down condition and resumes operation after the power down condition from a stored state, wherein the stored state is based upon a state of the device at approximately an onset of the power down condition. The device also includes a dynamic state machine having a dynamic latch embedded in the static integrated circuit environment. The dynamic state machine suspends operation during the power down condition, draws minimal power during the power down condition and resumes operation after the power down condition from the stored state.

BRIEF DESCRIPTION OF THE DRAWINGS

The present invention is illustrated by way of example and not limitation in the accompanying figures.

FIG. 3 illustrates the present invention with dynamic state machines embedded in a static integrated circuit environment.

FIG. 4 illustrates a dynamic state machine in accordance with the present invention.

FIG. 5 illustrates an embodiment of the present invention providing the present dynamic state machine power down capability such that minimal power is drawn during a power down condition.

DETAILED DESCRIPTION

Figure 1:
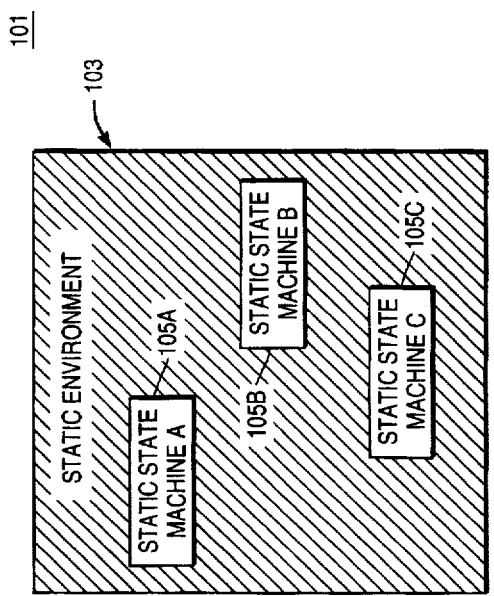
FIG. 1 illustrates a prior art microprocessor implemented in a static integrated circuit environment featuring static state machines.

An apparatus and a method for embedding a dynamic state machine in a static integrated circuit environment is disclosed. In the following description, numerous specific details are set forth such as specific devices, configurations and examples, etc. in order to provide a thorough understanding of the present invention. It will be obvious, however, to one having ordinary skill in the art that the specific details need not be employed to practice the present invention. In other instances, well known materials or methods have not been described in detail in order to avoid unnecessarily obscuring the present invention.

As described earlier, dynamic circuits are known to be smaller in area and faster than their static circuit counterparts. The present invention exploits the advantages of dynamic circuits by embedding a dynamic state machine in a static integrated circuit environment. A dynamic state machine is a state machine based on dynamic latches. By providing critical sections of a normally static VLSI circuit with dynamic state machines, the present invention achieves faster overall circuit performance with less area and retains the overall capability for the chip to be stopped in a static way. That is, the clock may be stopped and the chip may be "powered down" such that only a minimal amount of power is drawn.

FIG. 3 shows the present invention in a high level block diagram. Integrated circuit 301 is a static integrated circuit environment 303, such as a microprocessor, with dynamic state machine A 305A, dynamic state machine B 305B and dynamic state machine C 305C embedded in critical sections of the integrated circuit 301 to realize higher speed of operation with minimal integrated circuit area or power consumption. With the present invention, the static integrated circuit environment 303 retains its static properties such that the clock may be stopped, execution may be suspended resulting in minimum power consumption and circuit execution may be resumed from a stored state at the conclusion of the power down condition, even though dynamic state machines are embedded in the static integrated circuit environment. As shown in FIG. 3, dynamic state machine A 305A, dynamic state machine B 305 B and dynamic state machine C 305C are used in place of static state machine A 105A, static state machine B 105B and static state machine C 105C in prior art static integrated circuit environment 103 in order to achieve maximum integrated circuit throughput and performance.

FIG. 4 shows a schematic of a dynamic state machine 405 in accordance with the present invention. As shown in FIG. 4, dynamic state machine 405 includes a plurality of stages 407A and 407B. In the embodiment shown in FIG. 4, an output of stage 407A is received by an input of stage 407B. It is appreciated that the output of stage 407A may be received by any number of stages similar to 407B and that the output of stage 407A is not restricted to be received by only one stage. Conversely, it is also appreciated that stage 407B is not restricted to receive input from only one stage such as stage 407A. That is, stage 407B may receive input from any number of stages.

As shown in FIG. 4, each stage 407A and 407B of the present dynamic state machine 405 includes a latch 413 coupled to combinational logic 417. The present invention takes advantage of the fact that the input device of any combination logic inherently includes some parasitic capacitance. This parasitic capacitance is represented in FIG. 4 as capacitor 419. The present invention exploits this characteristic by directly coupling pass gate 415 to the input logic of combinational logic 417 to form dynamic latch 413. Pass gate 415 is clocked with clock signals CLK 409 and CLK# 411.

Figure 2:
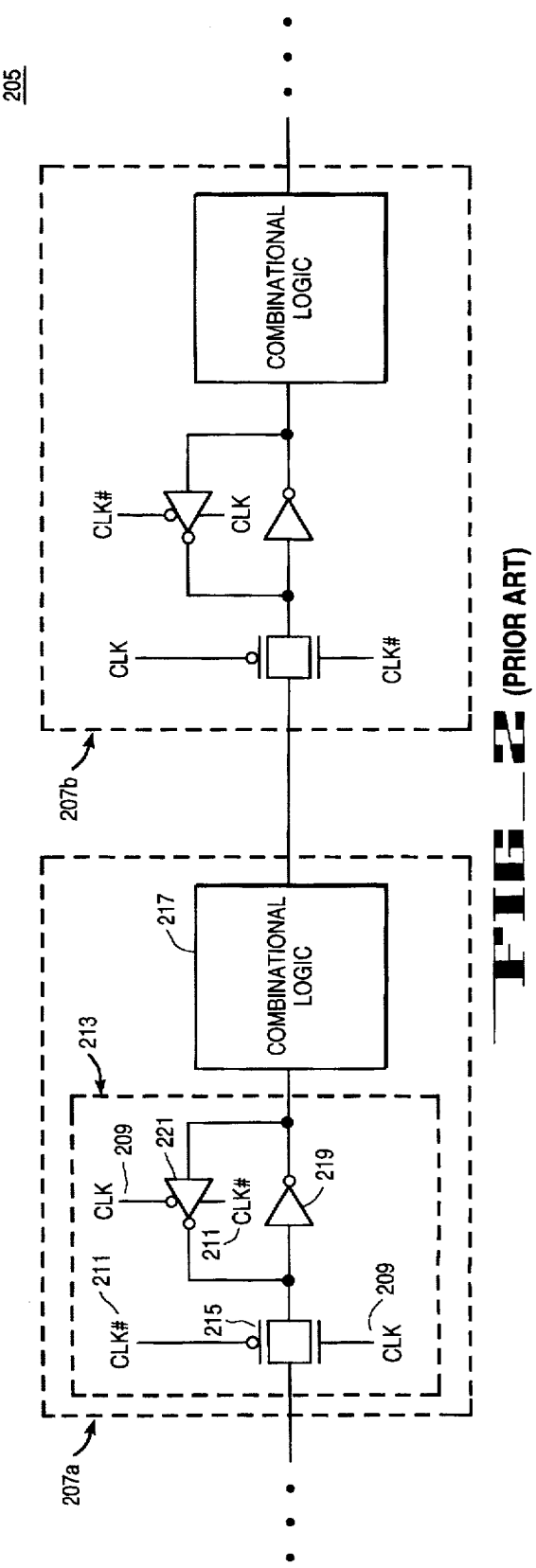
FIG. 2 illustrates a prior art static state machine featuring static latches in combination with combinational logic.

As a signal is received by dynamic state machine 405, it is latched with dynamic latch 413 with the value stored in capacitor 419. It is appreciated that dynamic state machine 405 is clocked at a sufficiently high frequency, such that no information is lost from dynamic latch 413. That is, so long as dynamic state machine 405 is clocked at a sufficient frequency dynamic state machine effectively operates as static state machine 205 as discussed with regard to FIG. 2. In contrast with static state machine 205, effective performance dynamic state machine 405 is realized with only two clocking nodes per latch 413 instead of four clocking nodes per latch 213. As a result, the load on clock signals 409 and 415 is reduced since there is less clock capacitance as well as fewer overall clocking nodes with the present invention.

In further contrast with prior art static state machine 205, present dynamic state machine 405 eliminates the need for storage elements 219 and 221 as parasitic capacitance 419 is exploited to retain latched information. As a result, less area is utilized by present dynamic state machine 405 in comparison with prior art static state machine 205. The benefits of this increased availability of area on the underlying integrated circuit substrate are further enjoyed as efforts to super-pipeline static microprocessors continues. As discussed earlier, super-pipelining results in an increased number of stages such as stages 407A and 407B in a dynamic state machine 405 with an increased clock frequency on CLK 409 and CLK# 411. For example, if the clock frequency were to be doubled, four dynamic state machine stages would be implemented instead of two. Therefore, there would be four latches 413 instead of two. In addition, combinational logic 417 would be correspondingly reduced and simplified. In extreme implementations, there may be as little as four or five or less logic stages (not shown) per combinational logic stage 417. Accordingly, the elimination of storage elements 219 and 221 becomes increasingly significant as an inverter 219 is eliminated for each stage 407 and two inverters are eliminated for each clock cycle. Therefore, the greater the effort to super-pipeline static integrated circuit environments, the greater are the benefits realized with the present invention.

As discussed earlier, dynamic circuits lack the characteristic of retaining memorized values with storage nodes when the clock is stopped as their static circuit counterparts. FIG. 5 shows a schematic of the present invention addressing this issue. FIG. 5 shows an integrated circuit 501, such as a microprocessor, including a static integrated circuit environment 503 with a dynamic state machine 505 embedded therein. In order to address the issue of dynamic state machine 505 not retaining latched values during a power down condition, static latch 523 is coupled to dynamic state machine 505 in critical areas in the circuit. As shown in FIG. 5, static latch 523 is coupled to an output of dynamic state machine 505 and latches the values output by dynamic state machine 505. In the present invention, latch 523 is distributed throughout static environment 503 at critical dynamic state machine 505 outputs such that static environment 503 may resume execution after a power down condition from the same state in which the dynamic state machine was in at the initiation of the power down condition.

It is noted that at the resumption of circuit operation after a power down condition, the externally latched values in dynamic state machine 505 are initially unknown. Accordingly, it is appreciated that the outputs of the first several cycles of dynamic state machine 505 are ignored with the present invention until the outputs of dynamic state machine 505 correspond with known inputs received at input 539 to dynamic state machine 505.

With static latch 523, the present invention is able to resume execution from the stored state after a power down condition with a dynamic state machine embedded in static integrated circuit environment 503. As shown in FIG. 5, static circuit 523 is implemented with front to back configured converters 529 and 531. It is appreciated that other static latch configurations may be used including an inverter-tri-state inverter configuration, or the like.

As further shown in FIG. 5, dynamic state machine 505 receives power from the power supply line coupled between $V_{CC}$ 535 and ground 537. As shown in FIG. 5, power down circuit 521 is coupled in series in the power supply line coupled between $V_{CC}$ 535 and ground 537. In the embodiment shown in FIG. 5, power down circuit 521 includes an NMOS transistor 525 acting as a switch. Power down signal line POWERDOWN# 533 is coupled to the gate of NMOS transistor 525 as shown in FIG. 5. In response to a power down condition, power down circuit 521 switches off the power supplied to dynamic state machine 505. Therefore, during a power down condition, when clocking is stopped, dynamic state machine 505 draws minimal power since the power supply line is switched off in response to power down signal line 533. When it is deemed suitable to power down, the microprocessor asserts POWERDOWN# and turns off transistor 525. As a result, there is no direct current path possible from $V_{CC}$ 535 to ground 537 in the dynamic state machine 505, and the internal nodes of dynamic state machine 505 float to unknown voltages. Accordingly, the power down signal line 533 also shuts off the final receiving latch 527 preventing any floated value at the output of dynamic state machine 505 from effecting the power down state of the static latch 523.

It is also noted that in order to allow dynamic state machine 505 to power down, the integrated circuit architecture must wait for the execution which is pending in dynamic state machine 505 to be completed before allowing the entire integrated circuit 501 to power down. In this way, no useful memory resides in dynamic state machine 505 when clocking is stopped, and therefore effectively no memory is lost since static latch 523 retains the critical information necessary in order to resume execution at the end of the power down condition. Therefore, in the power down state, just as in an all static integrated circuits, the current drawn by the present invention should be minimal. As discussed earlier, with dynamic state machine 305 in comparison with prior art static state machine 205 faster circuit operation is realized since an inverter is eliminated with each latch, thus eliminating two inverters per cycle. In addition, less clock capacitance is loaded onto clock signals and fewer integrated circuit devices are utilized therefore occupying less area, consuming less power and increasing circuit density.

It is further appreciated that although the embodiment described herein was presented with the example of a super-pipelined machine, practice of the present invention is beneficial in any static integrated circuit environment in which dynamic state machines having dynamic latches may be used in place of static state machines to increase speed, reduce power consumption, increase circuit density as well as reduce clock capacitance.

In the foregoing detailed description, an apparatus and a method for embedding a dynamic state machine in a static integrated circuit environment is described. The apparatus and method of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. In an integrated circuit on a substrate, the integrated circuit configured so as to be coupled to a power supply, a device comprising:

a static integrated circuit environment, the static integrated circuit environment suspending operation during a power down condition, the static integrated circuit environment drawing minimal power during the power down condition, the static integrated circuit resuming operation after the power down condition from a stored state, wherein the stored state is based upon a state of the device at approximately an initiation of the power down condition;

a dynamic state machine having a dynamic latch embedded in the static integrated circuit environment, the dynamic state machine suspending operation during the power down condition, the dynamic state machine drawing minimal power during the power down condition, the dynamic circuit resuming operation after the power down condition from the stored state: and a static latch coupled to an output of the dynamic state machine, wherein an output of the dynamic state machine is stored in the static latch.

2. The device described in claim 1 further comprising a power down circuit coupled to the dynamic state machine and a power down signal line, the power down circuit configured so as to minimize power drawn by the dynamic state machine in response to the power down signal line.

3. The device described in claim 1 wherein the static integrated circuit environment and the dynamic state machine are configured to receive a clock signal, wherein the clock signal is deactivated during the power down condition.

4. The device described in claim 1 wherein the dynamic state machine comprises a pass gate coupled to receive an input signal and a clock signal, the pass gate configured so as to pass the received input signal in response to the clock signal.

5. The device described in claim 4 wherein the dynamic latch comprises the pass gate directly coupled to an input of a first combinational logic, the input of the first combinational logic having a first capacitance.

6. The device described in claim 5 wherein the pass gate in combination with the first capacitance are configured so as to dynamically latch the input signal.

7. The device described in claim 2 wherein the power down circuit comprises a switch coupled in series with a power supply line of the dynamic state machine, the switch coupled to the power down signal line, the switch configured so as to switch off power to the dynamic state machine in response to the power down signal line.

8. A device described in claim 1 wherein the static environment is a microprocessor and the dynamic state machine is a pipelined portion of the microprocessor.

9. The device described in claim 8 wherein the pipelined portion of the microprocessor comprises a plurality of the dynamic latches coupled in series.

10. The device described in claim 8 wherein the microprocessor operates at a first clock speed and the pipelined portion of the microprocessor operates at a second clock speed, wherein the second clock speed is faster than the first clock speed.

11. A method for implementing an integrated circuit on a substrate, the method comprising the steps of:
providing a static integrated circuit environment in the integrated circuit, wherein operation of the static integrated circuit environment is suspended during a power down condition, wherein minimal power is drawn by the static integrated circuit environment drawing during the power down condition, wherein the static integrated circuit resumes operation after the power down condition from a stored state, wherein the stored state is based upon a state of the static integrated circuit environment at approximately an initiation of the power down condition;
embedding a dynamic state machine having a dynamic latch in the static integrated circuit environment;
latching an output of the dynamic state machine with a static latch;
suspending operation of the dynamic state machine during a power down condition in the static integrated circuit environment;
drawing minimal power with the dynamic state machine during the power down condition; and
resuming operation of the dynamic state machine from a stored state after the power down condition.

12. The method described in claim 11 further comprising the step of switching off power supplied to the dynamic state machine in response to a power down signal line, wherein minimal power is drawn by the dynamic state machine in response to the power down signal line.

13. The method described in claim 11 wherein the static integrated circuit environment and the dynamic state machine are configured to receive a clock signal, the method further comprising the step of deactivating the clock signal in response to the power down condition.

14. The method described in claim 11 wherein the dynamic state machine comprises a pass gate coupled to receive an input signal and a clock signal, the method further comprising the step of passing the input signal with the pass gate in response to the clock signal.

15. The method described in claim 14 wherein the dynamic latch comprises the pass gate directly coupled to an input of a first combinational logic, the input of the first combinational logic having a first capacitance, the method further comprising the step of dynamically latching the input signal passed from the pass gate with the first capacitance in combination with the pass gate.

16. The method described in claim 12 wherein a switch is coupled in series with a power supply line to the dynamic state machine, the switch switching off power to the dynamic state machine in response to the power down signal line.

17. The method described in claim 11 wherein the static environment and the dynamic state machine is a pipelined portion of the microprocessor.

18. The method described in claim 17 wherein the pipelined portion of the microprocessor comprises a plurality of the dynamic latches coupled in series.

19. The method described in claim 17 including the additional steps of clocking the microprocessor at a first clock speed and clocking the dynamic state machine at a second clock speed, wherein the second clock speed is faster than the first clock speed.

20. In an integrated circuit on a substrate, the integrated circuit configured so as to be coupled to a power supply, a device comprising:
a static integrated circuit environment, the static integrated circuit environment suspending operation during a power down condition, the static integrated circuit environment drawing minimal power during the power down condition, the static integrated circuit resuming operation after the power down condition from a stored state, wherein the stored state is based upon a state of the device at approximately an initiation of the power down condition; and
a dynamic state machine having a dynamic latch embedded in the static integrated circuit environment, the dynamic state machine suspending operation during the power down condition, the dynamic state machine drawing minimal power during the power down condition, the dynamic circuit resuming operation after the power down condition from the stored state, the dynamic latch having a pass gate coupled to receive an input signal and a clock signal, the pass gate configured so as to pass the received input signal in response to the clock signal, the pass gate directly coupled to an input of a first combinational logic, the input of the first combinational logic having a first capacitance.

21. The device described in claim 20 further comprising a static latch coupled to an output of the dynamic state machine, wherein an output of the dynamic state machine is stored in the static latch.

22. The device described in claim 20 further comprising a power down circuit coupled to the dynamic state machine and a power down signal line, the power down circuit configured so as to minimize power drawn by the dynamic state machine in response to the power down signal line.

23. The device described in claim 20 wherein the static integrated circuit environment and the dynamic state machine are configured to receive the clock signal, wherein the clock signal is deactivated during the power down condition.

24. The device described in claim 20 wherein the pass gate in combination with the first capacitance are configured so as to dynamically latch the input signal.

25. The device described in claim 22 wherein the power down circuit comprises a switch coupled in series with a power supply line of the dynamic state machine, the switch coupled to the power down signal line, the switch configured so as to switch off power to the dynamic state machine in response to the power down signal line.

26. A device described in claim 20 wherein the static environment is a microprocessor and the dynamic state machine is a pipelined portion of the microprocessor.

27. The device described in claim 26 wherein the pipelined portion of the microprocessor comprises a plurality of the dynamic latches coupled in series.

28. The device described in claim 26 wherein the microprocessor operates at a first clock speed and the pipelined portion of the microprocessor operates at a second clock speed, wherein the second clock speed is faster than the first clock speed.

* * * * *